US008294146B2

(12) United States Patent
Yamamuro et al.

(10) Patent No.: US 8,294,146 B2
(45) Date of Patent: Oct. 23, 2012

(54) ZNO-CONTAINING SEMICONDUCTOR LAYER AND DEVICE USING THE SAME

(75) Inventors: Tomofumi Yamamuro, Kawasaki (JP); Hiroyuki Kato, Yokohama (JP)

(73) Assignee: Stanley Electric Co., Ltd., Tokyo (JP)

( * ) Notice: Subject to any disclaimer, the term of this patent is extended or adjusted under 35 U.S.C. 154(b) by 487 days.

(21) Appl. No.: 12/611,234

(22) Filed: Nov. 3, 2009

(65) Prior Publication Data

US 2010/0123129 A1 May 20, 2010

(30) Foreign Application Priority Data

Nov. 14, 2008 (JP) .................................. 2008-292233

(51) Int. Cl.
*H01L 29/10* (2006.01)

(52) U.S. Cl. ........................... 257/43; 257/102; 257/103

(58) Field of Classification Search ................... 257/43, 257/102, 103; 438/104
See application file for complete search history.

(56) References Cited

U.S. PATENT DOCUMENTS

| 6,448,585 B1 * | 9/2002 | Kadota ........................ 257/103 |
| 6,939,731 B2 | 9/2005 | Ishizaki |
| 7,915,101 B2 * | 3/2011 | Jeong et al. .................. 438/151 |

FOREIGN PATENT DOCUMENTS

| EP | 1 890 344 A1 | 2/2008 |
| EP | 1 901 358 A1 | 3/2008 |
| EP | 1 391 941 B1 | 12/2008 |
| JP | 2003-069076 A | 3/2003 |
| JP | 2004-95634 A | 3/2004 |
| WO | WO 02/089223 A1 | 11/2002 |

* cited by examiner

*Primary Examiner* — Mark Prenty
(74) *Attorney, Agent, or Firm* — Holtz, Holtz, Goodman & Chick, PC

(57) ABSTRACT

Mg is doped in a ZnO-containing semiconductor layer in a concentration range from $1 \times 10^{17}$ cm$^{-3}$ to $2 \times 10^{20}$ cm$^{-3}$.

5 Claims, 9 Drawing Sheets

|  | Mg CONCENTRATION |
|---|---|
| SAMPLE 1 | $6.8 \times 10^{19}$ cm$^{-3}$ |
| SAMPLE 2 | $4.6 \times 10^{19}$ cm$^{-3}$ |
| SAMPLE 3 | $2.3 \times 10^{18}$ cm$^{-3}$ |
| SAMPLE 4 | $4.1 \times 10^{17}$ cm$^{-3}$ |

| | Mg CONCENTRATION |
|---|---|
| SAMPLE 5 | $3.8 \times 10^{19}$ cm$^{-3}$ |
| SAMPLE 6 | $1.2 \times 10^{18}$ cm$^{-3}$ |

ZNO-CONTAINING SEMICONDUCTOR LAYER AND DEVICE USING THE SAME

CROSS REFERENCE TO RELATED APPLICATION

This application is based on and claims priority of Japanese Patent Application JP 2008-292233 filed on Nov. 14, 2008, the entire contents of which are incorporated herein by reference.

BACKGROUND OF THE INVENTION

A) Field of the Invention

The present invention relates to a ZnO-containing semiconductor layer and a device using the ZnO-containing semiconductor layer.

B) Description of the Related Art

Zinc oxide (ZnO) is a direct transition type semiconductor having a band gap energy of 3.37 eV at room temperature, and has a relatively large excitonic binding energy of 60 meV as compared to other semiconductors. Source material is inexpensive, and influence upon environments and human bodies is small. It is expected to realize a light emitting device utilizing ZnO. Reports on devices having a high emission efficiency are rare until now, and improvement in device characteristics is a present research issue.

In manufacturing a light emitting device such as a light emitting diode (LED), improving the quality of each layer constituting a device results in improvement in the device quality such as an emission efficiency and electrical characteristics. The quality of a layer, particularly an emission layer in which recombination of electrons and holes occurs, greatly influences an emission efficiency. It is therefore important to improve the quality of an emission layer in order to obtain a better light emitting device. Techniques have been proposed for improving crystallinity of an emission layer by mixing Se or Te in the emission layer (refer to, for example, JP-A-2003-69076).

A contact resistance between semiconductor and an electrode is influenced by a carrier concentration in a contact layer on the semiconductor side. As a resistance of the contact layer is lowered, it becomes possible to improve the characteristics of a light emitting device. Techniques have been proposed for lowering an operation voltage of a ZnO-containing LED by forming a high concentration doping region of p-type impurities between a p-type contact layer and an electrode (refer to, for example, JP-A-2004-95634).

SUMMARY OF THE INVENTION

It is an object of the present invention to provide a ZnO-containing semiconductor layer and its manufacture method capable of improving, for example, crystallinity.

It is another object of the present invention to provide a ZnO-containing semiconductor light emitting device using such ZnO-containing semiconductor layer.

According to one aspect of the present invention, there is provided a ZnO-containing semiconductor layer wherein Mg is doped in a concentration range from $1\times10^{17}$ cm$^{-3}$ to $2\times10^{20}$ cm$^{-3}$.

According to another aspect of the present invention, there is provided a ZnO-containing semiconductor light emitting device including: a substrate; a first ZnO-containing semiconductor layer formed above the substrate and having a first conductivity type; a ZnO-containing semiconductor emission layer formed on the first ZnO-containing semiconductor layer; and a second ZnO-containing semiconductor layer formed on the ZnO-containing semiconductor emission layer and having a second conductivity type opposite to the first conductivity type, wherein at least one of the first ZnO-containing semiconductor layer, ZnO-containing semiconductor emission layer and second ZnO-containing semiconductor layer includes a ZnO-containing semiconductor layer into which Mg is doped in a concentration range from $1\times10^{17}$ cm$^{-3}$ to $2\times10^{20}$ cm$^{-3}$.

By doping Mg into a ZnO-containing semiconductor layer in a concentration range from $1\times10^{17}$ cm$^{-3}$ to $2\times10^{20}$ cm$^{-3}$, for example, crystallinity is improved. By using such ZnO-containing semiconductor layer, for example, as an emission layer of a ZnO-containing semiconductor light emitting device, it is possible to improve an emission intensity.

BRIEF DESCRIPTION OF THE DRAWINGS

FIG. 2 is a schematic cross sectional view of a sample measured in a first experiment.

FIG. 3 is a table enumerating Mg concentrations of samples in the first experiment.

DESCRIPTION OF THE PREFERRED EMBODIMENTS

First, description will be made on a crystal manufacture system for growing a ZnO-containing compound semiconductor crystal layer. A group II-VI compound semiconductor containing ZnO is called herein a ZnO-containing compound semiconductor (or ZnO-containing semiconductor).

Figure 1:
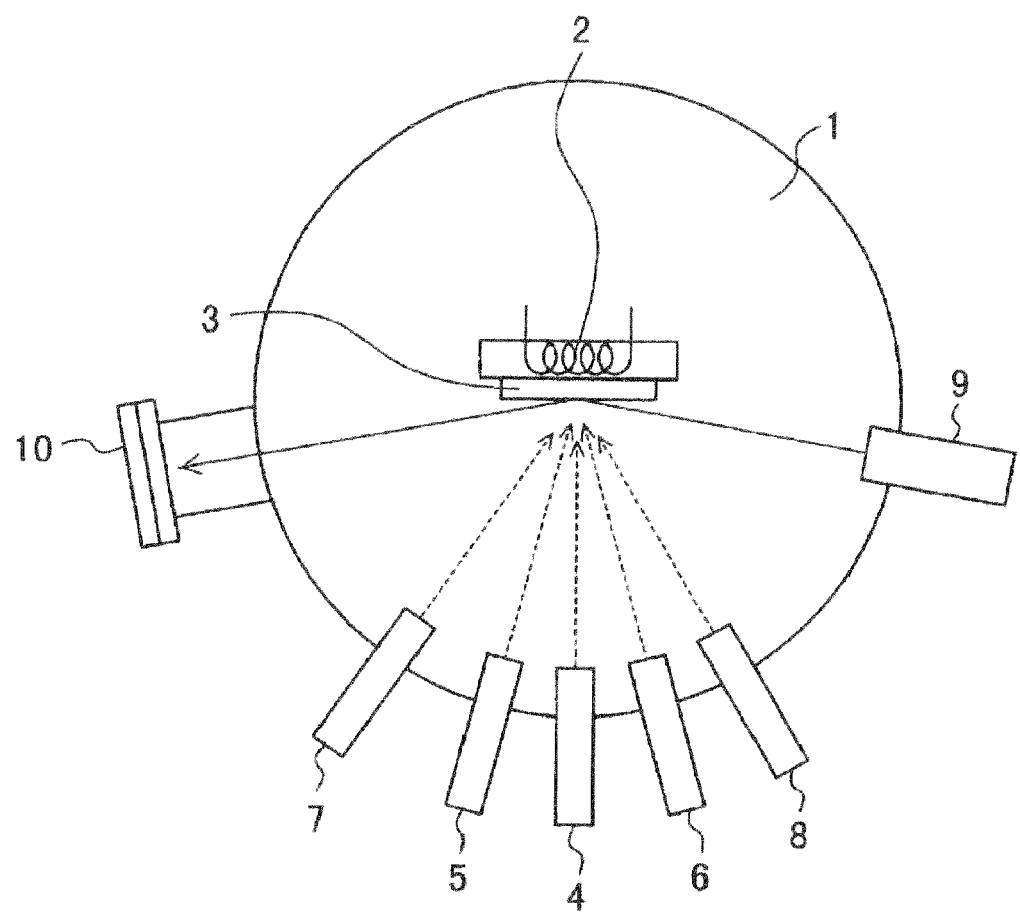
FIG. 1 is a schematic diagram illustrating an MBE crystal growing system.

FIG. 1 is a schematic diagram illustrating a crystal growth system utilizing molecular beam epitaxy (MBE). A stage 2 including a substrate heater is disposed in a vacuum chamber 1 to hold a substrate 3.

The vacuum chamber 1 is equipped with a Zn source gun 4, an O source gun 5, an Mg source gun 6, an N source gun 7 and a Ga source gun 8. The Zn source gun 4, Mg source gun 6 and Ga source gun 8 have Knudsen cells for accommodating solid sources of Zn, Mg and Ga, respectively, and emit a Zn beam, an Mg beam and a Ga beam, respectively.

The O source gun 5 and N source gun 7 have electrodeless discharge tubes at a high frequency of e.g., 13.56 MHz. The O source gun 5 and N source gun 7 make oxygen radicals and nitrogen radicals in the electrodeless discharge tubes, and emit an O radical beam and an N radical beam.

If another element is desired to be supplied, a corresponding source gun is prepared.

As a desired beam is supplied to the substrate 3 heated to a desired temperature with the substrate heater of the stage 2, it becomes possible to grow a ZnO-containing compound semiconductor crystal layer having a desired composition. As Ga is doped in ZnO, n-type conductivity is given, whereas N is doped, p-type conductivity is given.

A reflection high energy electron diffraction (RHEED) gun 9 and a screen 10 on which an RHEED image is displayed are mounted in the vacuum chamber 1.

Next, description will be made on the first experiment of measuring photoluminescence (PL) spectra of a single layer of a ZnO layer doped with Mg (ZnO:Mg layer).

FIG. 2 is a schematic cross sectional view of a sample measured in the first experiment. Each measurement sample was manufactured by MBE. A ZnO:Mg layer 22 was formed on a +c plane of ZnO substrate 21 heated to a temperature of 900° C. by applying a Zn beam, an O radical beam and an Mg beam at the same time.

The Zn beam was applied at a flux of $1.97 \times 10^{15}$ atoms/(cm$^2$s) by using Zn with a purity of 7N as a solid source. The O radical beam was applied by introducing pure oxygen gas with a purity of 6N at 2 sccm and forming oxygen plasma at an RF power of 300 W.

The Mg beam was applied at a flux of $2.15 \times 10^{13}$ atoms/(cm$^2$s) or smaller (a detection lower limit or smaller of a flux monitor) by using Mg with a purity of 6N as a solid source. A plurality of samples having different Mg concentrations were manufactured by changing a cell temperature of the Mg source in the range that a Mg beam flux is the detection lower limit or smaller of a flux monitor.

FIG. 3 is a table enumerating Mg concentrations of samples in the first experiment. An Mg concentration was measured by secondary ion mass spectroscopy (SIMS). Sample 1 had an Mg concentration of $6.8 \times 10^{19}$ cm$^{-3}$, sample 2 had an Mg concentration of $4.6 \times 10^{19}$ cm$^{-3}$, sample 3 had an Mg concentration of $2.3 \times 10^{18}$ cm$^{-3}$, and Sample 4 had an Mg concentration of $4.1 \times 10^{17}$ cm$^{-3}$.

A sample not doped with Mg was prepared in addition to the samples doped with Mg. The sample not doped with Mg was manufactured by omitting Mg application from the manufacture conditions of the samples doped with Mg. PL spectra were measured for these samples. An He—Cd laser beam (output power of 2 mW) at a wavelength of 325 nm was applied to the ZnO layer, and emission spectrum obtained through spectroscopy of photoluminescent light was measured with a photomultiplier tube.

Figure 4:
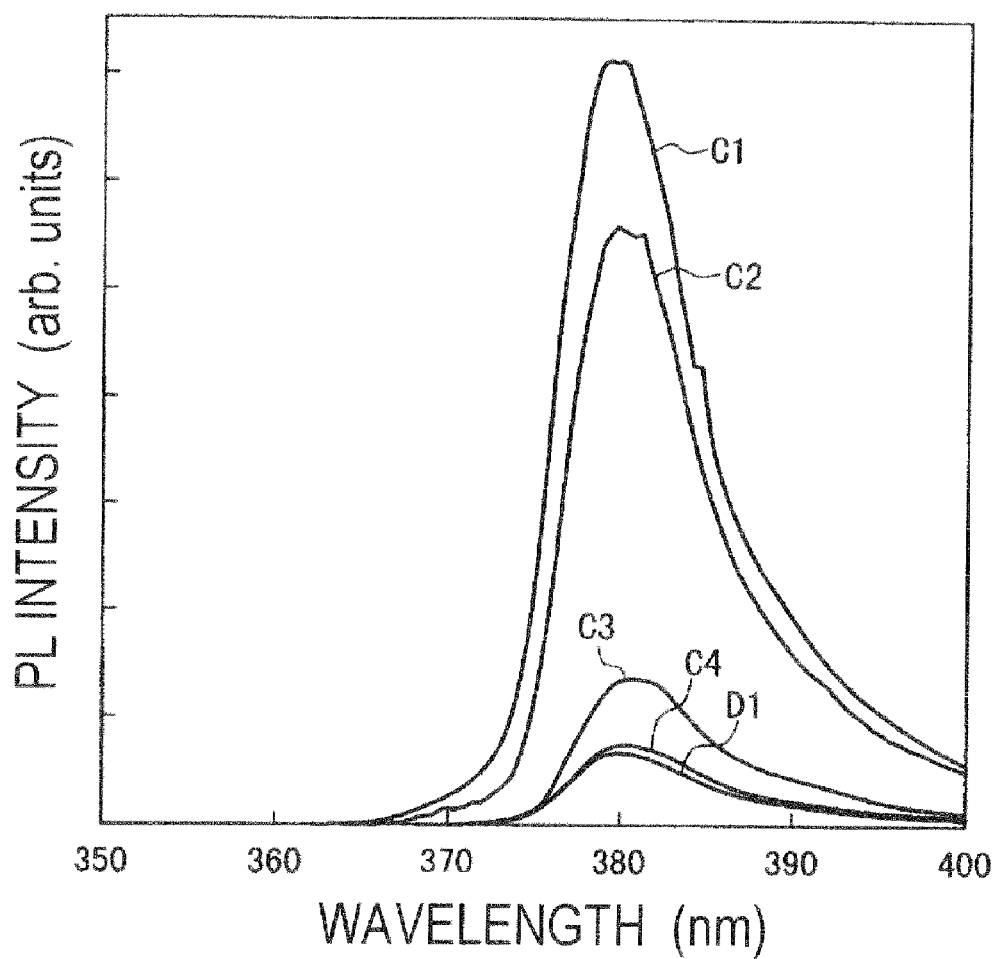
FIG. 4 illustrates PL spectra measured in the first experiment.

FIG. 4 illustrates measured spectra. Curves C1 to C4 indicate spectra of the Mg doped samples 1 to 4, respectively, and a curve D1 is a spectrum of the sample not doped with Mg.

An emission peak wavelength of the sample not doped with Mg, i.e., ZnO itself, is about 380 nm corresponding to band edge emission. An emission peak wavelength of the samples doped with Mg was also about 380 nm, and a shift of an emission wavelength was not observed. A band gap of the sample doped with Mg is therefore generally equal to that of ZnO.

A band gap energy of 3.37 eV is equivalent to a wavelength of 367 nm having a deviation from an observed emission wavelength of 380 nm. This may be ascribed to that an emission peak shifts to the longer wavelength side, from the band gap energy, corresponding in amount to a coupling energy and a binding energy due to donor deficiencies of exciton. This is one explanation among those conceivable causes.

It has been found surprisingly that as Mg is doped, an emission intensity increases, and the higher the Mg concentration is, the higher the emission intensity is. It is expected from the measurement result of the sample 4 (Mg concentration of $4.1 \times 10^{17}$ cm$^{-3}$) that an emission intensity increases if an Mg concentration is about $1 \times 10^{17}$ cm$^{-3}$ or higher.

It is considered that if an Mg concentration becomes too high, ZnO crystallinity degrades and an emission intensity at a band edge lowers. Since an increase tendency of an emission intensity continues to a concentration of the sample 1 (Mg concentration of $6.8 \times 10^{19}$ cm$^{-3}$), it is expected that the emission intensity increases up to an Mg concentration several times that of the sample 1, e.g., up to three times or about $2 \times 10^{20}$ cm$^{-3}$ or lower. It is considered that an emission intensity increases at least at a Mg concentration of about $1 \times 10^{20}$ cm$^{-3}$ or lower. It may be considered that an increase in the emission intensity indicates an improvement on ZnO crystallinity.

An MgZnO layer constituting a light emitting device to be described later contains Mg at a high concentration to the degree that a band gap of MgZnO is broadened more than that of ZnO in order to confine carriers. A ZnO:Mg layer has an Mg concentration lower than 1% so that a band gap of this layer is maintained to be equal to that of ZnO.

Next, description will be made on the second experiment of measuring electroluminescence (EL) spectra of a ZnO-containing light emitting diode (LED) having a double hetero structure and a ZnO:Mg layer as an emission layer.

Figure 5:
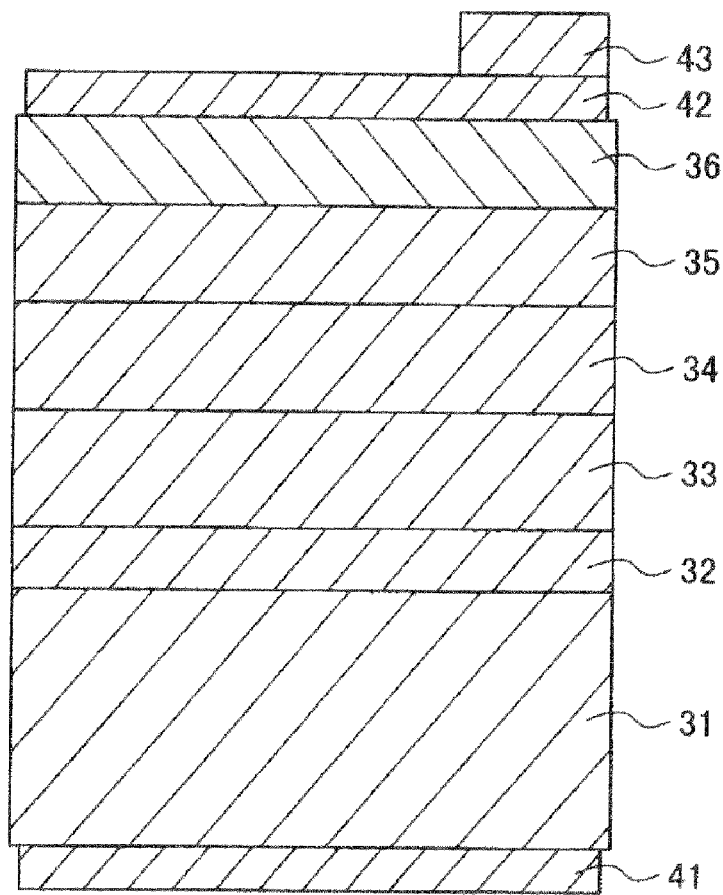
FIG. 5 is a schematic cross sectional view of a sample measured in a second experiment.

FIG. 5 is a schematic cross sectional view of a sample measured in the second experiment. A method of manufacturing a sample to be measured will be described. Each measurement sample was manufactured by MBE.

An n-type ZnO buffer layer 32 was formed on a +c plane of a c plane ZnO substrate 31. The ZnO buffer layer 32 was grown to a thickness of 30 nm by applying a Zn beam and an O radical beam at the same time at a substrate temperature of 350° C. It is preferable that a growth temperature of the n-type ZnO buffer layer 32 is in a range from 300° C. to 500° C. and a thickness thereof is in a range of 10 nm to 50 nm.

Next, annealing was performed for 20 minutes at 800° C. to improve crystallinity of the n-type ZnO buffer layer 32. It is preferable that an annealing temperature is in a range from 500° C. to 1000° C. and an annealing time is in a range from 3 minutes to 20 minutes.

As will be later described, ZnO is likely to have an n-type even if it is not doped. The c plane ZnO substrate 31 and ZnO buffer layer 32 of this experiment shows an n-type conductivity without doping impurities.

Next, an n-type ZnO layer 33 doped with Ga was formed on the n-type ZnO buffer layer 32. The n-type ZnO layer 33 was grown to a thickness of 200 nm by applying a Zn beam, an O radical beam and a Ga beam at the same time at a substrate temperature of 950° C. It is preferable that a growth temperature of the n-type ZnO layer 33 is in a range from 500° C. to 1000° C., a thickness thereof is in a range of 100 nm to 1000 nm, and a Ga concentration is $1 \times 10^{16}$ cm$^{-3}$ or higher.

Next, an n-type MgZnO layer 34 doped with Ga was formed on the n-type ZnO layer 33. The n-type MgZnO layer 34 was grown to a thickness of 50 nm by applying a Zn beam, an O radical beam, an Mg beam and a Ga beam at the same time at a substrate temperature of 950° C. It is preferable that a growth temperature of the n-type MgZnO layer 34 is in a range from 500° C. to 1000° C., a thickness thereof is in a range of 5 nm to 200 nm, and a Ga concentration is $1 \times 10^{16}$ cm$^{-3}$ or higher.

Next, a ZnO:Mg emission layer 35 was formed on the n-type MgZnO layer 34. The ZnO:Mg emission layer 35 was grown to a thickness of 10 nm by applying a Zn beam, an O radical beam and an Mg beam at the same time at a substrate temperature of 950° C. It is preferable that a growth temperature of the emission layer 35 is in a range from 500° C. to 1000° C. and a thickness thereof is in a range of 0.6 nm to 200 nm.

Next, a p-type MgZnO layer 36 doped with N was formed on the ZnO:Mg emission layer 35. The p-type MgZnO layer 36 was grown to a thickness of 50 nm by applying a Zn beam, an O radical beam, an Mg beam and an N radical beam at the same time at a substrate temperature of 800° C. It is preferable that a growth temperature of the p-type MgZnO layer 36 is in a range from 300° C. to 1000° C., a thickness thereof is in a range of 5 nm to 200 nm, and an N concentration is $1\times10^{18}$ $cm^{-3}$ or higher.

Next, an n-side electrode 41 was formed on the back surface of the n-type ZnO substrate 31. For example, the n-side electrode 41 is formed by laminating an Al layer having a thickness of 300 nm to 500 nm on a Ti layer having a thickness of 2 nm to 10 nm.

A p-side electrode 42 was formed on the p-type MgZnO layer 36, and a bonding electrode 43 was formed on the p-side electrode 42. For example, the p-side electrode 42 is formed by laminating an Au layer having a thickness of 0.1 nm to 20 nm on an Ni layer having a thickness of 0.5 nm to 5 nm. For example, the bonding electrode 43 is formed by laminating an Au layer having a thickness of 500 nm on an Ni layer having a thickness of 100 nm. Thereafter, an electrode alloying process is executed in an oxidizing gas atmosphere, for example, at 300° C. to 800° C. The process time is, for example, 30 seconds to 10 minutes. The electrode alloying process makes the p-side electrode 42 and p-type MgZnO layer 36 be tightly adhered, and makes the p-side electrode 42 transparent.

A ZnO-containing LED having a double hetero structure and a ZnO:Mg layer as an emission layer was manufactured in the manner described above. A plurality of samples having different Mg concentrations of emission layers were manufactured by changing a cell temperature of an Mg source when the ZnO:Mg emission layer 35 was formed.

Figures 6, 7:
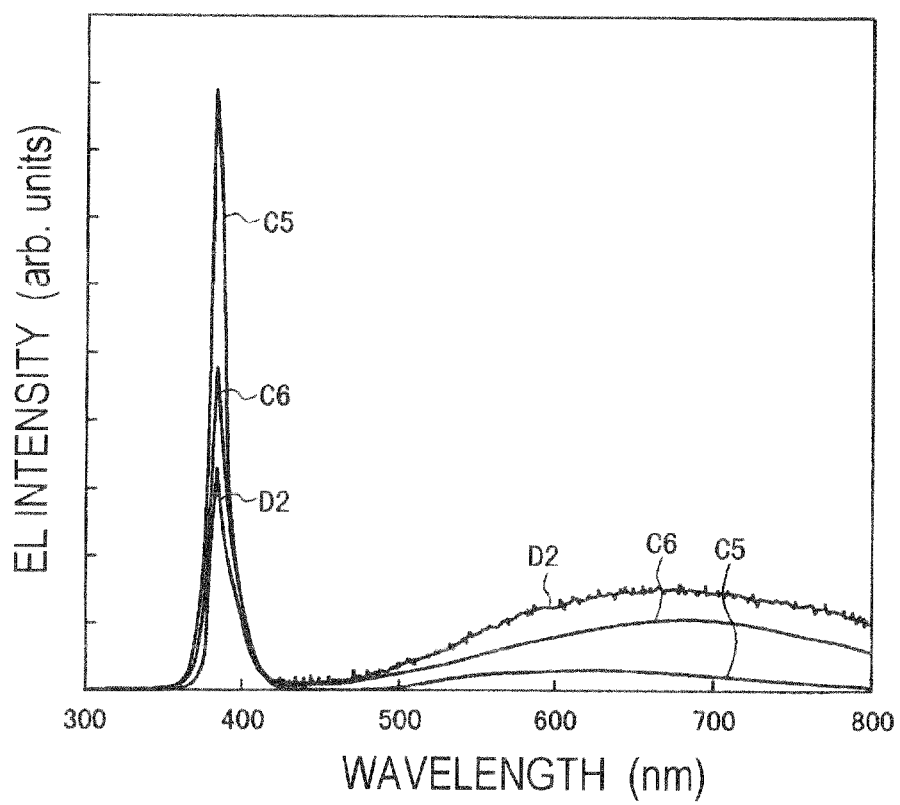
FIG. 6 is a table enumerating Mg concentrations of samples in the second experiment.
FIG. 7 illustrates EL spectra measured in the second experiment.

FIG. 6 is a table enumerating Mg concentrations of samples in the second experiment. An Mg concentration was measured by SIMS. Sample 5 had an Mg concentration of $3.8\times10^{19}$ $cm^{-3}$, and sample 6 had an Mg concentration of $1.2\times10^{18}$ $cm^{-3}$.

A sample not doped with Mg in the emission layer was prepared in addition to the samples doped with Mg in the emission layers. The sample not doped with Mg was manufactured by omitting Mg application from the manufacture conditions of the samples doped with Mg. A current of 20 mA was flowed through each sample, and spectroscopy of electroluminescent light was measured with a CCD camera.

FIG. 7 illustrates measured EL spectra. Curves C5 and C6 indicate spectra of the samples 5 and 6 doped with Mg in the emission layers, respectively, and a curve D2 is a spectrum of the sample not doped with Mg in the emission layer.

Similar to the PL spectra (refer to FIG. 4), an emission peak wavelength at a band edge is about 380 nm for both the sample doped with Mg in the emission layer and the sample riot doped with Mg in the emission layer, and the higher the Mg concentration is, the emission intensity increases more.

Every sample has a broad and low intensity peak on a longer wavelength side (e.g., 500 nm or longer) than an emission wavelength at the band edge. This peak is considered as emission from a deep level. It has been found that emission from a deep level is strongest for the sample not doped with Mg, and becomes weaker the higher the Mg concentration is.

Figure 8:
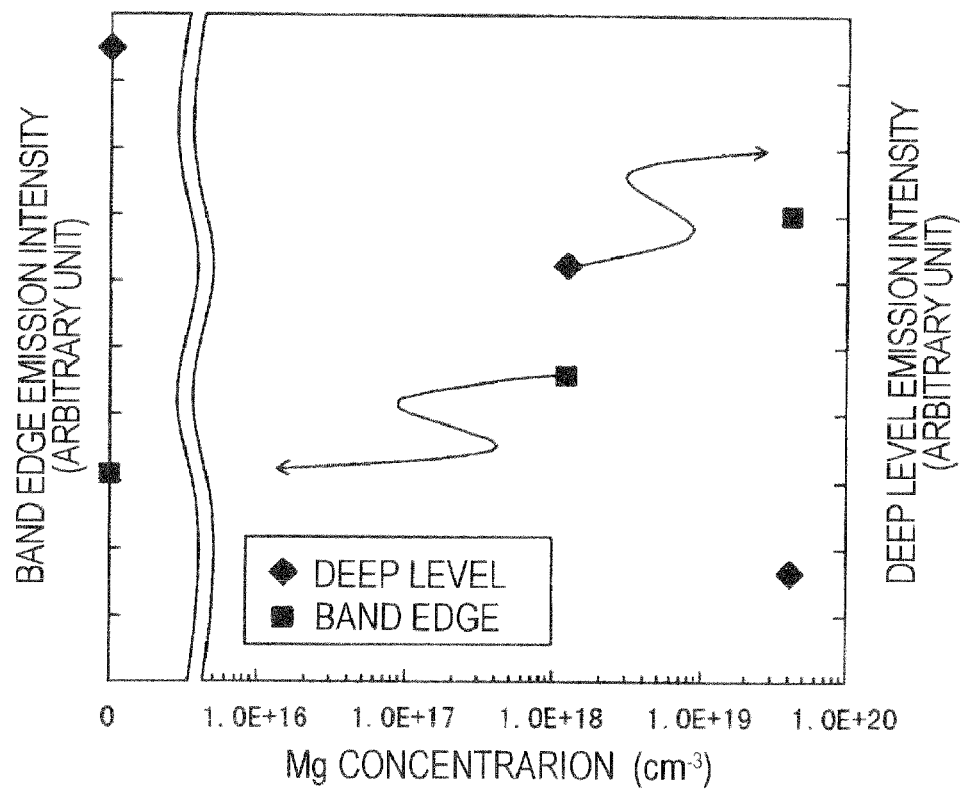
FIG. 8 is a graph plotting an emission intensity at a band edge and an emission intensity at a deep level relative to an Mg concentration, respectively of the EL spectra obtained in the second experiment.

FIG. 8 is a graph plotting an emission intensity at a band edge and an emission intensity at a deep level relative to an Mg concentration. An emission intensity is an integrated intensity of each peak. This graph indicates that as an Mg concentration increases, an emission intensity at a band edge increases and an emission intensity at a deep level reduces.

It is supposed that since Mg doping improves ZnO crystallinity, emission from a deep level lowers and an emission intensity at a band edge increases. It is said that one cause of emission from a deep level as seen in the EL spectrum of ZnO is O deficiency in ZnO. It may be considered that the result of the second experiment suggests a possibility that Mg doping mitigates O deficiency in ZnO.

Next, description will be made on the third experiment of measuring current-voltage characteristics of a ZnO-containing LED.

Figure 9:
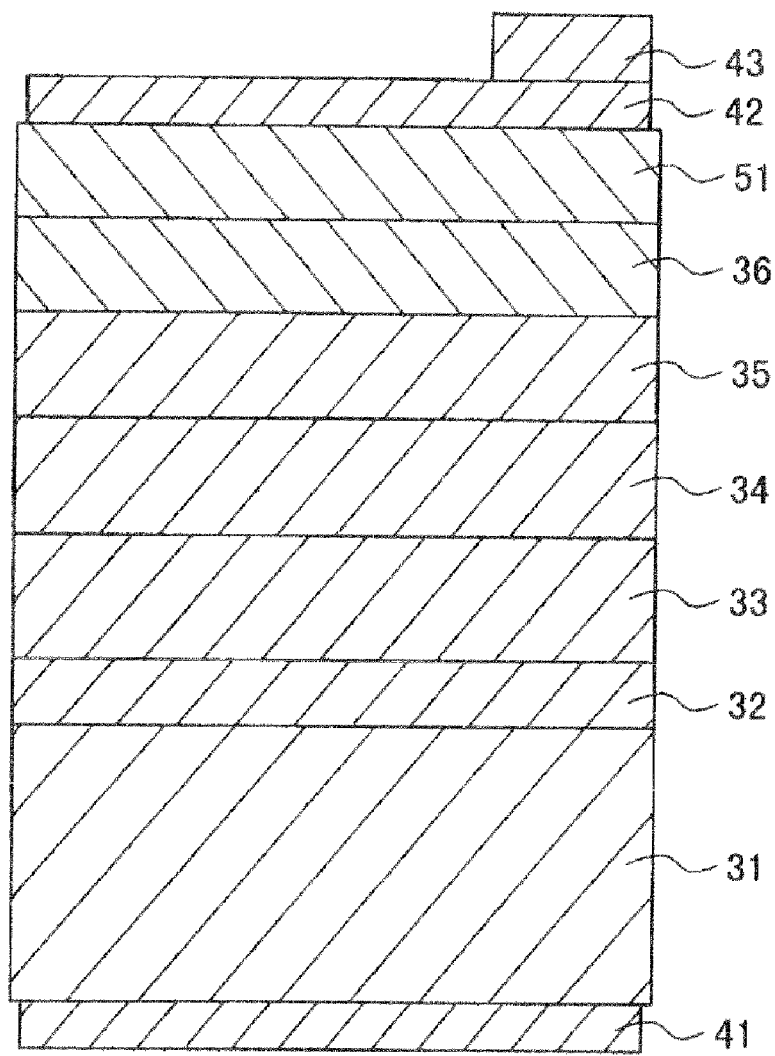
FIG. 9 is a schematic cross sectional view of a sample measured in a third experiment.

FIG. 9 is a schematic cross sectional view of a sample measured in the third experiment. The measurement sample in the third experiment has a layered structure of the ZnO-containing LED of the measurement sample in the second experiment, in which a p-type ZnO:Mg contact layer 51 is inserted between the p-type MgZnO layer 36 and the p-side electrode 42.

Description will be made on a method of forming the p-type ZnO:Mg contact layer 51. The p-type ZnO:Mg contact layer 51 was grown to a thickness of 7 nm by applying a Zn beam, an O radical beam, an Mg beam and an N radical beam at the same time at a substrate temperature of 800° C. An Mg concentration of the p-type ZnO:Mg contact layer 51 of the measurement sample was $7.2\times10^{19}$ $cm^{-3}$. It is preferable that a growth temperature of the p-type ZnO:Mg contact layer 51 is in a range from 300° C. to 1000° C., a thickness thereof is in a range of 1 nm to 100 nm, and an N concentration is $1\times10^{18}$ $cm^{-3}$ or higher.

A sample not doping Mg in the p-type ZnO contact layer was prepared in addition to the sample doping Mg in the p-type ZnO contact layer. The sample not doped with Mg was manufactured by omitting Mg application from the manufacture conditions of the p-type ZnO contact layer of the sample doped with Mg. Current-voltage characteristics were measured for these samples.

Figure 10A:
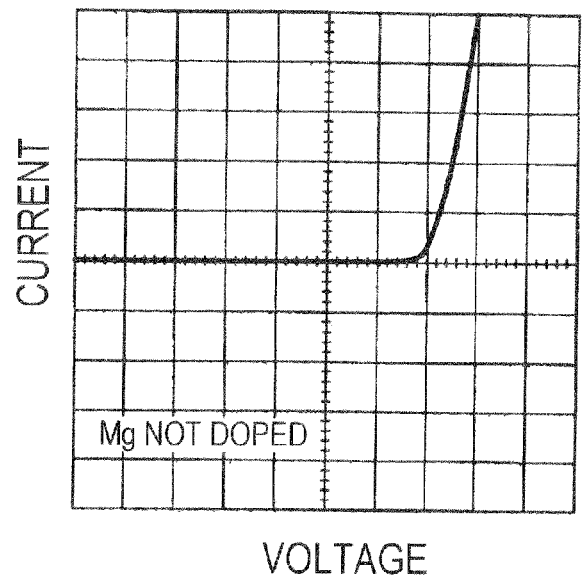
FIGS. 10A and 10B are graphs illustrating current-voltage characteristics of a sample not doped with Mg and a sample doped with Mg in the third experiment.
Figure 10B:
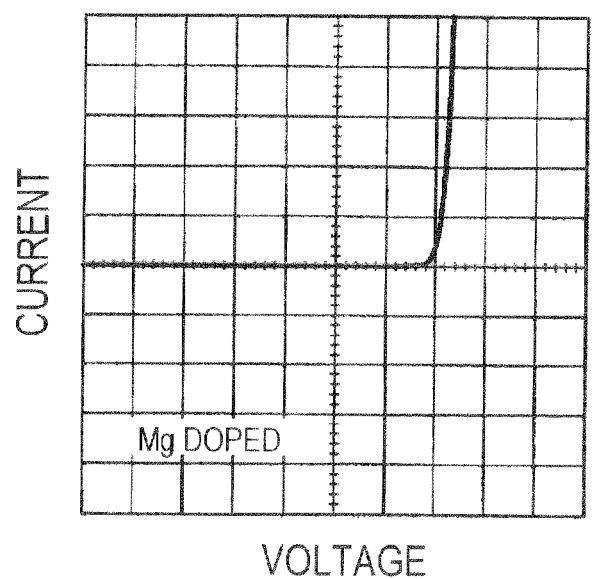

FIGS. 10A and 10B are graphs illustrating the current-voltage characteristics of the sample not doped with Mg and the sample doped with Mg. The abscissa represents a voltage in the unit of 2 V per scale, and the ordinate represents a current in the unit of 2 mA per scale. An area of the sample is 300 μm×300 μm.

As compared to the sample not doped with Mg, the sample doped with Mg has a steep rise of the current-voltage characteristics on the forward bias side. It can be understood therefore that an operation voltage of the light emitting device can be lowered by doping Mg in the p-type ZnO contact layer. One cause may be ascribed to that Mg doping improves crystallinity and a contact resistance between the p-type ZnO contact layer and the p-side transparent electrode lowers.

In the third experiment, although Mg is doped in the p-type ZnO semiconductor layer, Mg may be doped in an n-type ZnO-containing semiconductor layer. Also in this case, the effect of improving crystallinity is expected.

ZnO is likely to increase a residual electron concentration even if conductivity type determining impurities are not doped. For example, the residual electron concentration of a poor crystalline film is about $2\times10^{20}$ $cm^{-3}$, and the film is likely to become an n-type. One cause of increasing the residual electron concentration is considered as O deficiency. If Mg doping mitigates O deficiency as described above, there is a possibility that the residual electron concentration of un-doped ZnO lowers. There is therefore a possibility that p- and n-type conductivities are controlled properly by a conductivity determining impurity concentration. An increase in a carrier concentration is expected particularly in a p-type layer.

In the third experiment, there is a possibility that a contact resistance with the p-side electrode is lowered because of an increase in a carrier concentration of the p-type ZnO contact layer.

In the second experiment, an emission intensity at a band edge is increased by doping Mg in the emission layer of a ZnO-containing LED. In the third experiment, an electric resistance is lowered by doping Mg in the contact layer of a ZnO-containing LED.

Mg doping is not limited to these layers, but may be performed for other ZnO layers if necessary. Mg doping may be performed for a single layer or a plurality of layers. It is expected that Mg doping into a ZnO layer other than the emission layer suppresses, for example, optical absorption to be caused by defect levels, and increases the amount of light to be radiated outside the device.

The structure of a ZnO-containing LED is not limited to those in the second and third experiments. An emission layer may have a structure including a lamination of well layers and barrier layers.

Figure 11A:
FIGS. 11A and 11B are schematic cross sectional views of emission layers according to a modification.
Figure 11B:
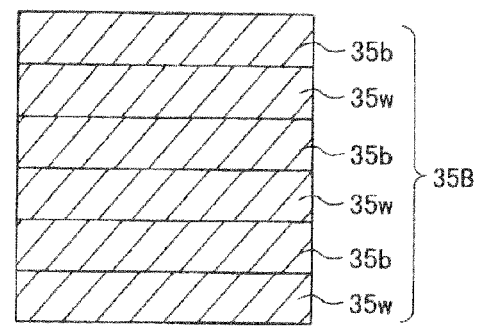

FIGS. 11A and 11B are schematic cross sectional views illustrating examples of an emission layer. An emission layer 35A illustrated in FIG. 11A has a lamination structure that a barrier layer 35b of MgZnO is stacked on a well layer 35w of ZnO:Mg. An emission layer 35B illustrates in FIG. 11B has a multiple quantum well (MQW) structure having three stacked layers of a lamination of a well layer 35w and a barrier layer 35b.

In an emission layer having the structure of a lamination of a well layer and a barrier layer, it is preferable that Mg is doped into at least the well layer to improve an emission intensity. Mg may be doped into a barrier layer (whose band gap is widened by an element other than Mg).

The emission layer may have a single layer (double hetero structure) like the second and third experiments) or a structure including a lamination of a well layer and a barrier layer. It is preferable that a growth temperature of an emission layer is 500° C. or higher to improve crystallinity and 1000° C. or lower in order to prevent re-vaporization of Zn.

A thickness of an emission layer of a single layer is preferably 0.6 nm or thicker in order to form a ZnO film uniformly because a lattice constant (c axis length) of ZnO is 0.52 nm, and 200 nm or thinner in order to lower an electrical resistance of the emission layer. In the case of the quantum well structure laminating a well layer and a barrier layer, a thickness is desired to be about 10 nm ensuring a quantum confining effect. An emission layer may be doped with n- or p-type impurities to control conductivity, and is able to be made thicker if an electrical resistance is able to be lowered.

Figure 12:
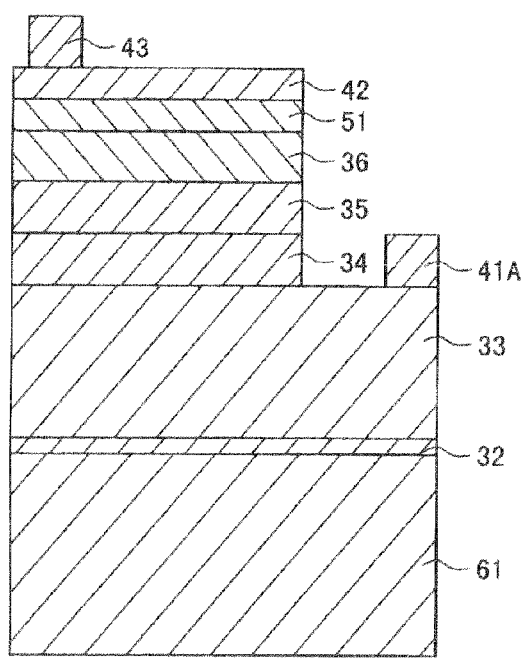
FIG. 12 is a schematic cross sectional view of an LED structure according to a modification.

FIG. 12 is a schematic cross sectional view of a modification of the LED structure in the third experiment. Similar to the third experiment, layers from the n-type ZnO buffer layer 32 to p-type ZnO contact layer 51 are formed on and above the ZnO substrate 61. A wafer formed with the layers up to the p-type ZnO contact layer 51 is picked up from a crystal manufacture system. Thereafter, a resist film, a protective film or the like is formed on the p-type ZnO contact layer 51 and patterned to form an etching mask having a recess window corresponding to a region where the n-side electrode is to be formed. By using this etching mask, the p-type ZnO contact layer 51, p-type MgZnO layer 36, emission layer 35 and n-type MgZnO layer 34 are etched by wet etching or reactive ion etching to thereby expose the n-type ZnO layer 33.

Next, for example, a Ti layer having a thickness of 10 nm to 100 nm is formed on the surface of the exposed n-type ZnO layer 33, and an Au layer having a thickness of 100 nm to 1000 nm is stacked on the Ti layer to form an n-side electrode 41A. After the n-side electrode 41A is formed, the etching mask is removed.

Next, a p-side electrode 42 is formed on the p-type ZnO contact layer 51, and a bonding electrode 43 is formed on the p-side electrode 42. The p-side electrode 42 is formed, for example, by laminating an Au layer having a thickness of 0.1 nm to 20 nm on an Ni layer having a thickness of 0.5 nm to 5 nm. The bonding electrode 43 is formed, for example, by laminating an Au layer having a thickness of 1000 nm on an Ni layer having a thickness of 100 nm. The p-side electrode 42 and bonding electrode 43 are formed by properly using a mask to prevent electrode material on the p-side from being deposited upon the n-side electrode 41A. Thereafter, an electrode alloying process is executed in an oxidizing gas atmosphere at a temperature of, e.g., 300° C. to 800° C. A process time is, for example, 30 seconds to 10 minutes. The LED structure of this modification may use also an insulating substrate.

A structure may also be used removing the n-type MgZnO layer 34 or the n-type MgZnO layer 34 and p-type MgZnO layer 36 from the LED structure (refer to FIG. 9) in the third experiment and the LED structure (refer to FIG. 12) of the modification.

In the LED structure in the third experiment (refer to FIG. 9) or the like, the n-type ZnO layer 33 and n-type MgZnO layer 34 may be regarded as one n-type ZnO-containing semiconductor layer, and the p-type MgZnO layer 36 and p-type ZnO:Mg layer 51 may be regarded as one p-type ZnO-containing semiconductor layer.

It is said that an electron carrier concentration and a hole carrier concentration of a light emitting device such as LED is required to be $1\times10^{16}$ cm$^{-3}$.

A concentration of n-type impurity Ga doped in the ZnO layer and MgZnO layer is preferably set to $1\times10^{16}$ cm$^{-3}$ or higher in order to acquire effective electron carriers, and $7\times10^{19}$ cm$^{-3}$ or lower in order to suppress three-dimensional growth. Instead of Ga, n-type impurity of a group III element such as Al and In and a group VII element such as F, Cl and Br may be used, and two or more elements such as Ga+Al may also be used. The above-described concentration range is almost effective also for the group III element such as Al and In. If a sufficient residual electron concentration is ensured without doping Ga or the like, an un-doped ZnO layer or an un-doped MgZnO layer may be used as an n-type layer.

A concentration of p-type impurity N doped in the ZnO layer and MgZnO layer is preferably set to $1\times10^{18}$ cm$^{-3}$ or higher in order to acquire effective hole carriers, and $5\times10^{20}$ cm$^{-3}$ or lower in order to suppress dislocation and defect in the layer. More preferably, the concentration is in a range from $1\times10^{19}$ cm$^{-3}$ to $3\times10^{20}$ cm$^{-3}$. Instead of N, p-type impurity of a group V element such as As and P and a group I element such as Li, Na and K may be used, and two or more elements such as N+P may also be used.

N becomes an acceptor by being replaced with a portion of O sites of ZnO, and has an ion radius nearer to that of O than those of other group V elements, providing stable replacement. For N doping, gas sources such as $N_2$, $N_2O$, NO, $N_2+O_2$ and $NH_3$ and various sources containing N are used.

In the embodiments described above, although a c plane ZnO substrate is used and crystal is grown on the +c plane, crystal may be grown on −c plane. An a plane or m plane ZnO substrate may also be used. A substrate for forming a ZnO-containing semiconductor device is not limited to a ZnO substrate, but other substrates may also be used including a sapphire ($Al_2O_3$) substrate, a silicon carbide (SiC) substrate, a gallium nitride (GaN) substrate and an MgZnO substrate.

A ZnO substrate is preferable because a substrate having as small a lattice mismatch as possible is suitable for a ZnO-containing semiconductor layer having good crystallinity. In manufacturing a light emitting device, it is preferable to use an MgZnO substrate having a larger band gap than that of ZnO in order to suppress substrate absorption of radiation light from the emission layer.

Although crystal growth by MBE has been described in the embodiments, vapor phase epitaxial growth such as metal organic vapor phase epitaxy (MOVPE) may also be used.

Although Mg is doped in ZnO in the embodiments, it is expected that doping Mg into ZnO-containing semiconductor improves, for example, crystallinity. For example, it is expected that Mg is doped into ZnO-containing mixed crystal such as $Cd_aZn_{1-a}O$, $Be_aZn_{1-a}O$, $Ca_aZn_{1-a}O$ (all $0<a<1$), $ZnO_{1-b}S_b$, $ZnO_{1-b}Se_b$, $ZnO_{1-b}Te_b$ (all $o<b<1$).

Application of Mg doping into ZnO semiconductor is not limited to a light emitting device, but Mg doping may be applied to other semiconductor devices using ZnO-containing material. ZnO-containing material is applicable to electrodes (transparent conductive films), electronic devices such as transistors, sensors (humidity sensor, ultra violet sensor) or the like, in addition to light emitting devices such as LED's and laser diodes.

Although the present invention has been described above in connection with the embodiments, the present invention is not limited thereto. For example, it is apparent for those skilled in the art that various alterations, improvements, combinations and the like are possible.

What are claimed are:

1. A ZnO-containing semiconductor light emitting device comprising:
    a substrate;
    a first ZnO-containing semiconductor layer formed above said substrate and having a first conductivity type;
    a ZnO-containing semiconductor emission layer formed on said first ZnO-containing semiconductor layer; and
    a second ZnO-containing semiconductor layer formed on said ZnO-containing semiconductor emission layer and having a second conductivity type opposite to said first conductivity type,
    wherein at least one of said first ZnO-containing semiconductor layer, said ZnO-containing semiconductor emission layer and said second ZnO-containing semiconductor layer includes a ZnO-containing semiconductor layer into which Mg is doped in a concentration range from $1 \times 10^{17}$ cm$^{-3}$ to $2 \times 10^{20}$ cm$^{-3}$.

2. The ZnO-containing semiconductor light emitting device according to claim 1, wherein said emission layer is a single layer, and Mg is doped in said emission layer in a concentration range from $1 \times 10^{17}$ cm$^{-3}$ to $2 \times 10^{20}$ cm$^{-3}$.

3. The ZnO-containing semiconductor light emitting device according to claim 1, wherein said emission layer has a structure including a lamination of a well layer and a barrier layer, and Mg is doped into at least said well layer in a concentration range from $1 \times 10^{17}$ cm$^{-3}$ to $2 \times 10^{20}$ cm$^{-3}$.

4. The ZnO-containing semiconductor light emitting device according to claim 1, further comprising an electrode formed on said second ZnO-containing semiconductor layer, wherein Mg is doped into a surface layer of said second ZnO-containing semiconductor layer contacting said electrode in a concentration range from $1 \times 10^{17}$ cm$^{-3}$ to $2 \times 10^{20}$ cm$^{-3}$.

5. The ZnO-containing semiconductor light emitting device according to claim 4, wherein said second conductivity type is a p-type.

* * * * *